United States Patent [19]
Huang et al.

[11] Patent Number: 5,565,694
[45] Date of Patent: Oct. 15, 1996

[54] LIGHT EMITTING DIODE WITH CURRENT BLOCKING LAYER

[76] Inventors: Kuo-Hsin Huang, 10-1Fl., No. 36, Sec. 1, Kwang Fu Road., Hsinchu City, Taiwan; Tzer-Perng Chen, 3Fl., No. 55, Alley 10, Lane 81, Kwang Hua Street 2, Hsinchu City, Taiwan

[21] Appl. No.: 500,043

[22] Filed: Jul. 10, 1995

[51] Int. Cl.$^6$ .............................. H01L 33/00; H04L 5/26
[52] U.S. Cl. .............................. 257/97; 257/96; 257/98; 372/45; 372/46
[58] Field of Search .................... 257/96, 97, 98; 372/45, 46

[56] References Cited

FOREIGN PATENT DOCUMENTS 3283676  12/1991  Japan ........................... 257/96

OTHER PUBLICATIONS

*Appl Phys Lett* Yokoyama et al. "Enhanced in Microcavities" 57 (26) 24 Dec. 1990 pp. 2814–2816.

Primary Examiner—Jerome Jackson
Attorney, Agent, or Firm—Jason Z. Lin

[57] ABSTRACT

A light emitting diode includes a first conductivity type GaAs substrate having a second conductivity type region as a current blocking layer. A first conductivity type distributed Bragg reflector layer is formed on the GaAs substrate. An AlGaInP double heterostructure including a lower cladding AlGaInP layer of the first conductivity type, an undoped active AlGaInP layer, and an upper cladding AlGaInP layer of the second conductivity type is grown on top of the distributed Bragg reflector layer. The undoped active AlGaInP layer can also be replaced by a multi-layer quantum well structure of AlGaInP or a strained multi-layer quantum well structure of AlGaInP. A second conductivity type layer of low energy band gap and high conductivity material is formed on the AlGaInP double heterostructure. A GaP window layer of the second conductivity type is then formed on top of the low energy band gap layer.

4 Claims, 3 Drawing Sheets

LIGHT EMITTING DIODE WITH CURRENT BLOCKING LAYER

FIELD OF THE INVENTION

This invention relates to a semiconductor light emitting diode, and more specifically to the improvement of the structure of a light emitting diode with current blocking layer.

BACKGROUND OF THE INVENTION

In recent years, there are many new developments in the area of AlGaInP light emitting diodes with high efficiency. Among the newest AlGaInP light emitting diodes, many of them are based on a double heterostructure comprising an upper cladding layer, a lower cladding layer, and an active layer between them. In general, the light emitting efficiency is quite limited because of the high resistivity in the upper cladding layer that makes the spread of the electric current difficult. Several techniques and structures have been developed to improve the luminous efficiency for the light emitting diodes. One technique in the commonly used double heterostructure is to grow various types of window layer or layers above the upper cladding layer to help the spread of the current. The other popular approach is to add a current blocking layer above the upper cladding layer to increase the current density and decrease the light absorbed by the electrode.

As shown in FIG. 1, a conventional light emitting diode based on a double heterostructure has an n-type GaAs substrate 12. Below the substrate is an n-type electrode 11. A distributed Bragg reflector layer (DBR) 13 is grown above the substrate first before growing an AlGaInP double heterostructure on the substrate. The double heterostructure includes an n-type AlGaInP lower cladding layer 14, an undoped active AlGaInP layer 15 and a p-type AlGaInP upper cladding layer 16. A p-type thin layer 17 with low energy band gap and high conductivity is formed on top of the double heterostructure. A p-type GaP window layer 18 is then grown above the thin layer 17. Above the window layer 18 is the p-type electrode 19 of the light emitting diode.

Although the electric current can travel uniformly through the active layer of the diode structure described above and the diode can emit light across the whole active area, some portion of the light is blocked by the p-type electrode 19. The blocked light can not emit out of the diode. As illustrated by the arrow lines shown in FIG. 1, the light underneath the electrode can not pass through the electrode. Therefore, the luminous efficiency of the light emitting diode is limited.

U.S. Pat. No. 5,153,889 presents an improvement of the light emitting diode structure developed by Toshiba of Japan to overcome the above drawback. As shown in FIG. 2, the structure includes an n-type electrode 21, an n-type GaAs substrate 22, a lower cladding layer 23, an active layer 24, an upper cladding layer 25, a window layer 26, and a p-type electrode 27. The lower cladding layer 23, active layer 24 and upper cladding layer 25 form an AlGaInP double heterostructure for the light emitting diode. Below the p-type electrode 27 and between the window layer 26 and the double heterostructure, a current blocking layer 20 is formed on top of the double heterostructure. Although light emitting diodes of the above structure can increase their current density and light emitting efficiency, the manufacturing process requires two times of MOVPE process. Because of the difficulty in MOVPE process, in particular, the second MOVPE process is performed on top of the p-type AlGAInP layer that contains Aluminum, the technique is cumbersome and difficult to practice.

SUMMARY OF THE INVENTION

The present invention has been made to overcome the above difficulty in forming the current blocking layer in the structure of a light emitting diode. This invention presents a new structure for the current blocking layer. In this invention, the current blocking layer is not grown between the top p-type electrode and the double heterostructure. Instead, a current blocking layer is formed between the n-type electrode and the double heterostructure.

The current blocking layer is formed by diffusing Zn to the GaAs substrate before growing the double heterostructure. Therefore, the manufacturing of the diode of this invention only requires one MOVPE process. In addition, the diffusion of Zn in the GaAs substrate is a simple process. Thus, the present invention described a diode structure that can be manufactured with high yield rate. It provides good current blocking effect and high light emitting efficiency as well. The principle of this invention and other advantages can further be understood from the following detailed description and accompanying drawings.

DETAILED DESCRIPTION OF THE PREFERRED EMBODIMENTS

Figure 1:
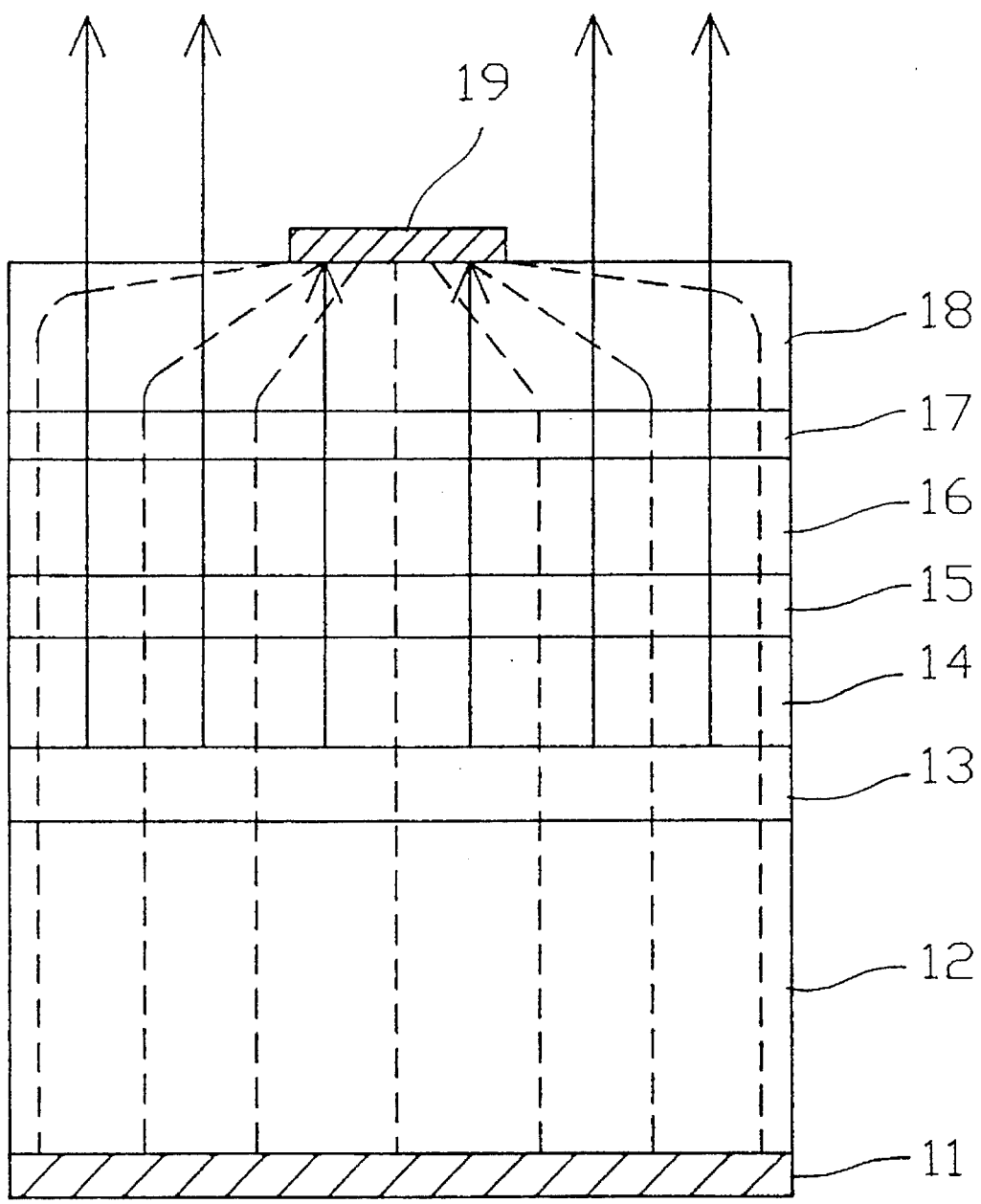
FIG. 1 shows a sectional view of the/structure of a commonly used double heterostructure light emitting diode that does not include a current blocking layer.
Figure 2:
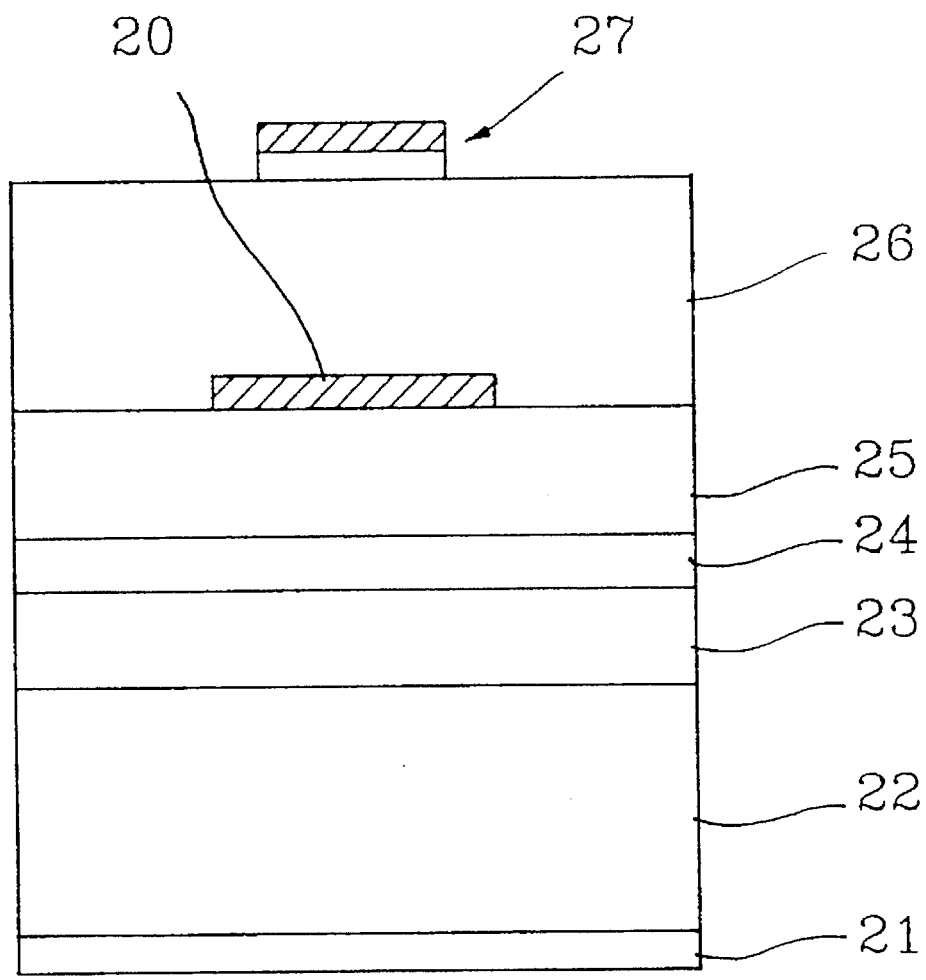
FIG. 2 shows a sectional view of the structure of a double heterostructure light emitting diode that includes a current blocking layer described in U.S. Pat. No. 5,153,889.
Figure 3:
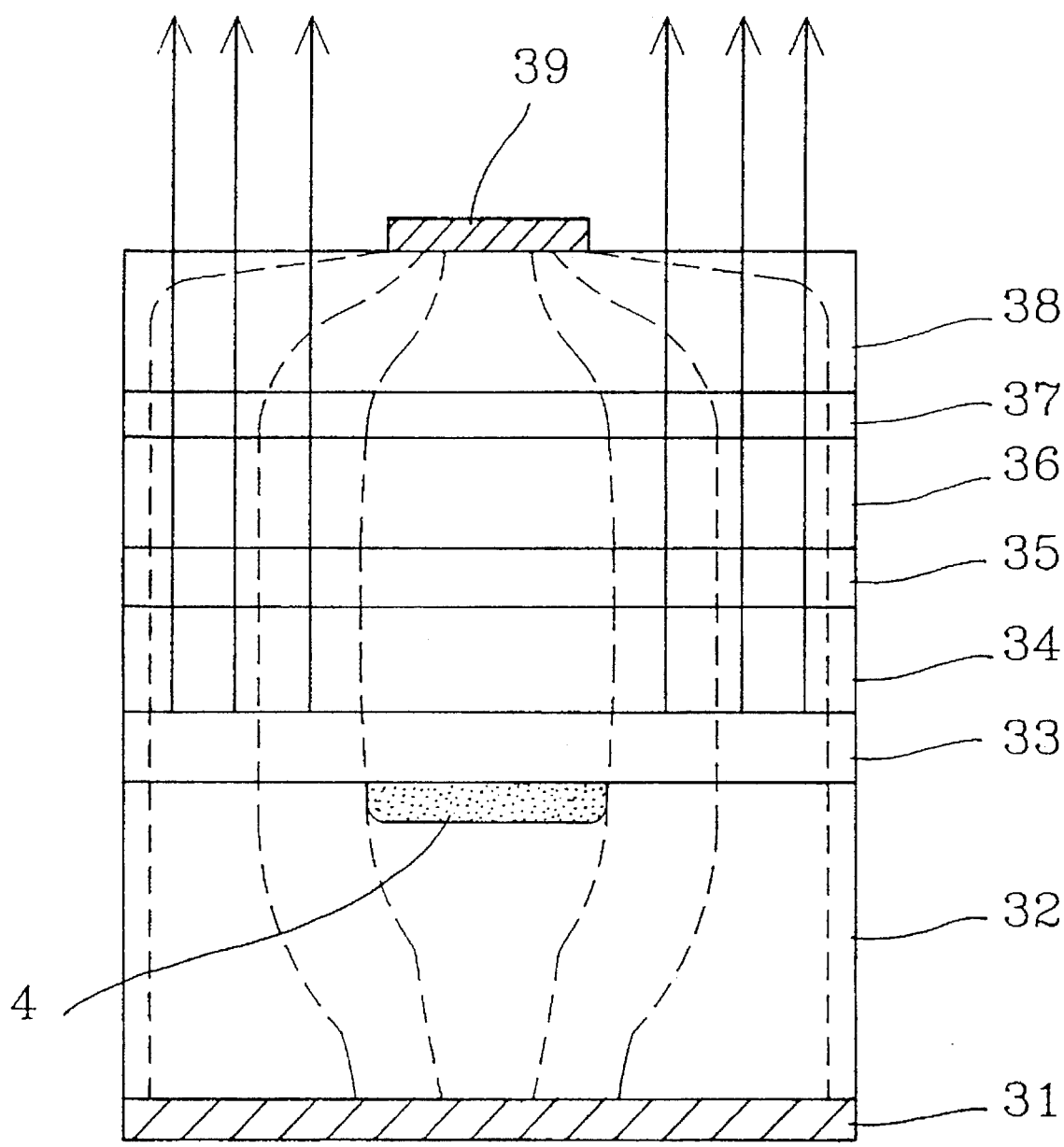
FIG. 3 shows a sectional view of the structure of the light emitting diode of this invention.

The schematic sectional view of the present invention is shown in FIG. 3. The structure of the light emitting diode includes an n-type GaAs substrate 32, Below the substrate is an n-type electrode 31. A Zn diffusion region 4 is formed by a diffusion process. The area is directly below the electrode 39 that is formed in the later process as shown in FIG. 3. The Zn diffusion region is the current blocking layer of the light emitting diode in this invention.

An n-type distributed Bragg reflector layer 33 is grown above the GaAs substrate and on top of the current blocking layer. The thickness of each reflector layer 33 is a quarter wavelength of the light wave emitted by the diode. Its material can be multi-layer crystal comprises AlAs and GaAs or AiInP and AlGaInP. An AlGaInP double heterostructure is then grown on top of the reflector layer 33. The double heterostructure of the diode includes an n-type AlGaInP lower cladding layer 34, an undoped AlGaInP active layer 35, and a p-type AlGaInP upper cladding layer 36. A thin p-type low energy band gap and high conductivity layer 37 is grown on top of the double heterostructure. A p-type GaP window layer 38 is formed above layer 37. Above the window layer 38 is the p-type electrode 39.

In the structure of the present invention, the undoped AlGaInP active layer 35 can be replaced by an AlGaInP multi-layer quantum well or strained quantum well. The light emitting diode comprising the structure of this invention blocks the electrical current in the Zn diffusion region 4 and does not allow it to flow through the active layer area above the diffusion region 4. The dotted lines in FIG. 3 shows the current flow. Therefore, the current density in the active layer outside the diffusion region is increased. The luminous intensity is also enhanced. In addition, the emitted light is not blocked by the p-type electrode. The arrow lines in FIG. 3 illustrates the emitted light. The light emitting efficiency of the diode is increased.

As described above, the structure of the light emitting diode of this invention provides higher light intensity. According to the experiment, the light intensity is increased by approximately a factor of 2. Another important advantage of this invention is the ease in manufacturing. As illustrated in FIG. 3 and discussed above, the current blocking area is a Zn diffusion region 4 between the double heterostructure and the n-type electrode 31. It is an easy manufacturing process to diffuse Zn in the GaAs substrate. Therefore, the current blocking layer is easily formed.

Although the Toshibas patent also has a current blocking layer, the layer lies between the heterostructure and the p-type electrode of the light emitting diode. The formation of the current blocking layer requires a MOVPE process to grow the epitaxial layers up to the current blocking layer, then etching part of the blocking layer and finally using the second MOVPE process to grow the top window layer. Hence, to manufacture the diode requires two MOVPE processes and the second MOVPE process that involves the growth of crystal on top of AlGaInP layer containing aluminum is a very difficult technique. The present invention not only has the same current blocking effect to provide higher light emitting intensity but also has the advantage of easy manufacturing and, hence, higher yield.

The current blocking layer of the present invention can also be formed by diffusing other metallic element such as Mg, Be or Cd into the GaAs substrate. The formation of the current blocking layer can also be achieved by implanting Zn, Mg, Be or Cd ions into the GaAs substrate.

Although only the preferred embodiments of this invention were shown and described in the above description, it is requested that any modification or combination that comes within the spirit of this invention be protected.

What is claimed is:

1. A light emitting diode having a current blocking layer comprising:

a semiconductor substrate GaAs of a first conductivity type, said substrate having a top side and a bottom side;

a first electrode formed on said bottom side of said substrate;

a second conductivity type region formed by diffusing or implanting metallic ions into said top side of said substrate, said region forming a current blocking area;

an AlGaInP double heterostructure grown on said top side of said GaAs substrate, said double heterostructure including a lower cladding AlGaInP layer of said first conductivity type, an undoped active AlGaInP layer, and an upper cladding AlGaInP layer of said second conductivity type;

a low energy band gap and high conductivity layer of said second conductivity type formed on said AlGaInP double heterostructure;

a GaP window layer of said second conductivity type formed on said low energy band gap and high conductivity layer; and a second electrode formed on a part of said window layer.

2. The light emitting diode according to claim 1, wherein said undoped active AlGaInP layer is replaced by a multi-layer quantum well structure having AlGaInP.

3. The light emitting diode according to claim 1, wherein said undoped active AlGaInP layer is replaced by a strained multi-layer quantum well structure having AlGaInP.

4. The light emitting diode according to claim 1, wherein a distributed Bragg reflector of said first conductivity type lies between the GaAs substrate and the AlGaInP double heterostructure.

* * * * *